United States Patent
Endou et al.

(10) Patent No.: US 7,180,176 B2
(45) Date of Patent: Feb. 20, 2007

(54) RADIATION PLATE AND POWER SEMICONDUCTOR MODULE IC PACKAGE

(75) Inventors: Hideki Endou, Shizuoka-ken (JP); Shingo Yanase, Iwata (JP)

(73) Assignee: Dowa Mining Co., Ltd., Tokyo (JP)

( * ) Notice: Subject to any disclaimer, the term of this patent is extended or adjusted under 35 U.S.C. 154(b) by 346 days.

(21) Appl. No.: 10/487,396

(22) PCT Filed: Aug. 22, 2002

(86) PCT No.: PCT/JP02/08479

§ 371 (c)(1), (2), (4) Date: May 10, 2004

(87) PCT Pub. No.: WO03/019655

PCT Pub. Date: Mar. 6, 2003

(65) Prior Publication Data

US 2004/0194861 A1    Oct. 7, 2004

(30) Foreign Application Priority Data

Aug. 23, 2001 (JP) ............... 2001-252488

(51) Int. Cl.
*H01L 23/36* (2006.01)
*C22C 9/00* (2006.01)
*C22C 9/06* (2006.01)

(52) U.S. Cl. .............. 257/712; 420/485; 420/496; 420/499

(58) Field of Classification Search .......... None
See application file for complete search history.

(56) References Cited

U.S. PATENT DOCUMENTS 3,640,779 A * 2/1972 Ence .................. 148/411

(Continued)

FOREIGN PATENT DOCUMENTS

JP        55-104447    *  8/1980

(Continued)

OTHER PUBLICATIONS

Copper.org—Properties of Wrought and Cast Copper Alloys—C19210, 2 pages, no date.*

(Continued)

*Primary Examiner*—John J. Zimmerman
(74) *Attorney, Agent, or Firm*—Frishauf, Holtz, Goodman & Chick, P.C.

(57) ABSTRACT

Heat dissipating plate (4) made of copper-base alloy is proposed that exhibits high degree of flatness after joining in the step of assembling power semiconductor modules, IC packages, etc., that will not crack in the solder (3) joint if subjected to heat cycles during joining or in an environment of use, and that has high heat conductivity and cost effectiveness. The heat dissipating plate (4) uses a copper-base alloy having a 0.2% yield strength of at least 300 N/mm$^2$ which is characterized in that the 0.2% yield strength after heating at 400° C. for 10 minutes is at least 90% of the 0.2% yield strength before heating and that said copper-base alloy has a heat conductivity of at least 350 W/m·K and contains at least one element of the group consisting of Fe, Co and Ni plus P in a total amount of 0.01–0.3%; the heat dissipating plate (4) is 10–200 mm long on each side, 0.1–5 mm thick and warped by 200 μm or less in a curved shape with a radius of curvature of at least 100 mm; this heat dissipating plate (4) exhibits high degree of flatness after the assembling step and assures improved heat dissipating performance.

16 Claims, 4 Drawing Sheets

U.S. PATENT DOCUMENTS

| | | | |
|---|---|---|---|
| 4,605,532 A * | 8/1986 | Knorr et al. | 420/472 |
| 4,634,824 A * | 1/1987 | Takano | 200/266 |
| 4,822,562 A * | 4/1989 | Miyafuji et al. | 420/472 |
| 5,147,469 A * | 9/1992 | Kanzaki et al. | 148/684 |
| 5,205,878 A * | 4/1993 | Kanzaki et al. | 148/684 |
| 5,343,073 A * | 8/1994 | Parthasarathi et al. | 257/666 |
| 5,814,168 A * | 9/1998 | Hatakeyama et al. | 148/682 |
| 6,139,975 A | 10/2000 | Mawatari et al. | |
| 6,511,866 B1 * | 1/2003 | Bregante et al. | 438/127 |
| 6,695,934 B1 * | 2/2004 | Bhargava | 148/434 |

FOREIGN PATENT DOCUMENTS

| | | | |
|---|---|---|---|
| JP | 04-072795 | * | 3/1992 |
| JP | 04-180549 | * | 6/1992 |
| JP | 06-088177 | * | 3/1994 |
| JP | 6-100983 A | | 4/1994 |
| JP | 6-236947 A | | 8/1994 |
| JP | 7-201895 A | | 8/1995 |
| JP | 7-331363 A | | 12/1995 |
| JP | 8-222658 A | | 8/1996 |
| JP | 10-168532 | * | 6/1998 |
| JP | 10-270612 | * | 10/1998 |
| JP | 11-21602 A | | 1/1999 |
| JP | 11-26966 A | | 1/1999 |
| JP | 11-251483 A | | 9/1999 |
| JP | 2000-239762 A | | 9/2000 |
| JP | 2000-311971 A | | 11/2000 |
| JP | 2000-311972 A | | 11/2000 |
| JP | 2001-189408 A | | 7/2001 |

OTHER PUBLICATIONS

MatWeb- Copper, UNS C19210, H02 Temper Sheet, 2 pages, no date.*

* cited by examiner

RADIATION PLATE AND POWER SEMICONDUCTOR MODULE IC PACKAGE

This application is the United States national phase application of International Application PCT/JP02/08479 filed Aug. 23, 2001.

TECHNICAL FIELD

This invention relates to a heat dissipating plate that uses copper-base alloys and which is to be employed in semiconductor apparatuses such as power semiconductor modules and IC packages.

BACKGROUND ART

Power semiconductor modules are semiconductor apparatuses that are composed of a semiconductor device (1), a copper pattern (14), an insulating substrate (15), a conductor layer (16) and a heat dissipating plate (4) and they are extensively used in home electronic appliances such as air conditioners and washing machines, as well as in automobiles and industrial machines.

The recent trend of IC packages as in PCs is toward higher density and greater sophistication in functions; as a result, heat generation has become an important problem to deal with and the heat dissipating plate (4) called "a heat spreader" is currently used. Since the heat generated from power semiconductor modules and IC packages must be efficiently dissipated, the heat dissipating plate (4) is required to have high heat conductivity.

Other diverse characteristics are required of the heat dissipating plate (4). Take, for example, a power semiconductor module; in the assembling step, a metal-ceramics joined board (2) (hereunder referred to as "joined board (2)") and the heat dissipating plate (4) are joined by solder (3) and the integrity of the solder (3) joint is important; also important is the flatness of the heat dissipating plate (4) since it is mounted on a heat sink.

During use, the power semiconductor module is subject to extensive temperature changes depending upon the operating situation and stress is exerted on the solder (3) joint between the joined board (2) and the heat dissipating plate (4) that have different thermal expansion coefficients. During such heat cycles, no defects such as cracking should occur in the solder (3) joint.

Speaking of the heat dissipating plate (4) that is to be used in IC packages, the reliability of the joint to the semiconductor chip is important; the heat dissipating plate (4) that is to be used in BGA packages and the like needs sufficient strength (rigidity) to serve as a back plate. Its strength (rigidity) should not drop in the assembling step.

Thus, the heat dissipating plate (4) to be used in power semiconductor modules and IC packages must satisfy diverse requirements including good heat conductivity; further, their prices are desirably low in view of the declining prices of home electronic appliances and PCs.

As the material (9) to be used in the heat dissipating plate (4), Cu—Cu$_2$O, Al—SiC, Cu—W and other combined systems that are close to the insulating substrate (15) and IC chips in terms of thermal expansion coefficient may be considered but they are not cost-effective, nor do they have adequate heat conductivity.

Instead, copper-base alloys that have high heat conductivity and are also advantageous costwise are extensively used. Oxygen-free copper, which has high heat conductivity and is common as the material (9) for the heat dissipating plate (4), does not provide adequate 0.2% yield strength for the material (9) and hence is not capable of preventing the deformation of the heat dissipating plate (4) which is also required to work as a reinforcement. In addition, the heat dissipating plate (4) needs to be heated at 200–350° C. for several minutes in the joining step. If oxygen-free copper is heated under this condition, the material (9) will soften, making it difficult to achieve the desired flatness of the heat dissipating plate (4) after assembly.

Aside from oxygen-free copper, Cu—Zr, Cu—Ag, Cu—Sn, Cu—Sn—P and Cu—(Fe,Co,Ni)—P systems are practical copper-base alloys having high heat conductivity. However, the P-free Cu—Zr, Cu—Ag and Cu—Sn systems will have higher oxygen concentration if they are melted and solidified in the atmosphere during casting. To deal with this problem, a facility capable of atmosphere control is required but this causes a disadvantage in terms of production cost. The Cu—Zr and Cu—Ag systems are also disadvantageous in terms of the prices of their ingredients. Further, the Cu—Ag system is not satisfactory in 0.2% yield strength and heat-resisting characteristic; as for the Cu—Sn system, there occurs insufficiency in 0.2% yield strength and heat-resisting characteristic if the Sn concentration is low whereas there occurs a drop in heat conductivity if the Sn concentration is high. The Cu—Sn—P system has similar characteristics to the Cu—Sn system. Although conventionally not recognized as the material (9) for the heat dissipating plate (4), the Cu—(Fe,Co,Ni)—P system is a precipitation-strengthening type copper-base alloy and has good balance between physical properties. (0.2% yield strength and heat resistance) and electrical conductivity.

However, the above-mentioned copper-base alloys have thermal expansion coefficients of $16 \times 10^{-6} \sim 18 \times 10^{-6}$/K whereas of all AlN, Al$_2$O$_3$, etc. which are used in the insulating substrate (15) of the power semiconductor module, and Si, etc. which are used in semiconductor chips have thermal expansion coefficients of less than $10 \times 10^{-6}$/K; hence, in the case of using those copper-base alloys as the material (9) for the heat dissipating plate (4), the reliability of the joint during assembly has been a problem to address.

Consider, for example, the power semiconductor module; if the heat dissipating plate (4) is joined to the joined board (2) by means of solder (3), the former will warp due to the thermal expansion mismatch as the solder (3) solidifies (see FIG. 3). If such warped heat dissipating plate (4) is screwed to a heat sink, the area of contact is so small that the required heat dissipating quality cannot be obtained. If the heat sink and the heat dissipating plate (4) are joined by means of an increased number of screws with a view to increasing the area of their contact, cracking may occur in the solder (3) joint or the insulating substrate (15) may break. Therefore, the flatness of the heat dissipating plate (4) after assembly has been a problem to address.

The present invention has been accomplished in view of these problems and has as an object providing the heat dissipating plate (4) that is suitable for use in semiconductor apparatuses such as power semiconductor modules and IC packages and which is inexpensive, has high heat conductivity and assures a highly reliable joint during assembly and use.

DISCLOSURE OF THE INVENTION

This invention provides the heat dissipating plate. (4) which uses a copper-base alloy that has high heat conductivity, that does not cause the material (9) to soften as the result of heating during assembly and that has high rigidity as a reinforcement; the invention also provides the heat dissipating plate (4) that is controlled in size and amount of warpage in accordance with joining conditions such as joining temperature, time and the area of a joint with a view to achieving a reliable joint and a highly flat heat dissipating plate (4) by overcoming the thermal expansion mismatch with the insulating substrate (15) of a power semiconductor module and the semiconductor chip in an IC package; the invention further provides a power semiconductor module and an IC package using the above-mentioned heat dissipating plates (4).

Thus, the present invention provides the following:

1. a heat dissipating plate (4) which is a copper-base alloy having a 0.2% yield strength of at least 300 N/mm$^2$ and a heat conductivity of at least 350 W/m·K;
2. a heat dissipating plate (4) which is a copper-base alloy having a 0.2% yield strength of at least 300 N/mm$^2$ and a heat conductivity of at least 350 W/m·K and further characterized in that the 0.2% yield strength after heating at 400° C. for 10 minutes is at least 90% of the 0.2% yield strength before said heating;
3. a heat dissipating plate (4) which is a copper-base alloy having a 0.2% yield strength of at least 300 N/mm$^2$ and a heat conductivity of at least 350 W/m·K and further characterized in that the crystal grain size after heating at 400° C. for 10 minutes is no more than 25 μm;
4. a heat dissipating plate (4) which is a copper-base alloy having a 0.2% yield strength of at least 300 N/mm$^2$ and a heat conductivity of at least 350 W/m·K and further characterized in that the 0.2% yield strength after heating at 400° C. for 10 minutes is at least 90% of the 0.2% yield strength before said heating and that the crystal grain size after said heating is no more than 25 μm;
5. the heat dissipating plate (4) according to any one of 1–4 above, wherein said copper-base alloy contains at least one element selected from the group consisting of Fe, Co and Ni plus P in a total amount of 0.01–0.3 wt % (the wt % used to describe the alloy's composition is hereunder referred to simply as %), with the balance being incidental impurities and copper;
6. the heat dissipating plate (4) according to any one of 1–5 above, which is a square or a rectangle each side of which is 10–200 mm long and warped by 200 μm or less, said heat dissipating plate (4) being 0.1–5 mm thick;
7. the heat dissipating plate (4) according to any one of 1–5 above, which is a square or a rectangle each side of which is 10–200 mm long and warped in a curved shape with a radius of curvature of at least 100 mm, said heat dissipating plate (4) being 0.1–5 mm thick;
8. the heat dissipating plate (4) according to any one of 1–5 above, which is a square or a rectangle each side of which is 10–200 mm long and warped by 200 μm or less in a curved shape with a radius of curvature of at least 100 mm, said heat dissipating plate (4) being 0.1–5 mm thick;
9. a power semiconductor module or an IC package which use the heat dissipating plate (4) according to any one of 1–8 above.

BEST MODE FOR CARRYING OUT THE INVENTION

Figure 1:
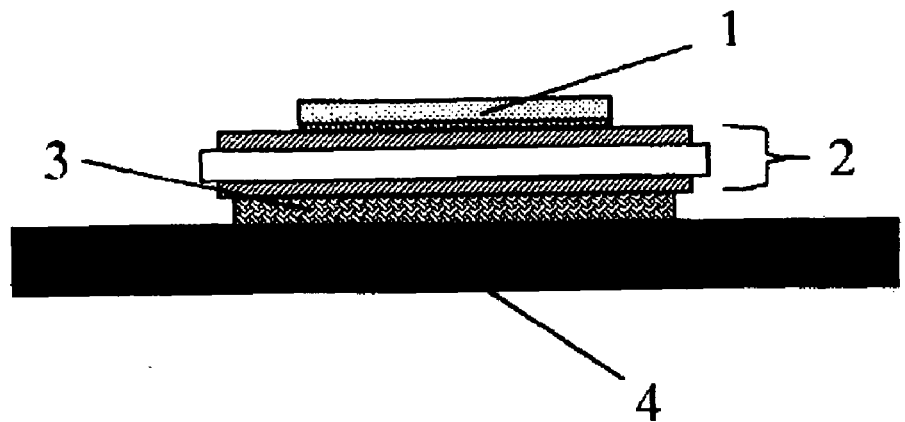
FIG. 1 is a side view of a power semiconductor module.

The present invention is described below in a specific way. The heat dissipating plate (4) needs to work as a reinforcement (as a back plate), so it must have mechanical strength. As-assembled power semiconductor modules and IC packages are required not to deform; in other words, the heat dissipating plate (4) itself is required not to deform. In this respect, a measure for the ability of the copper-base alloy used in the heat dissipating plate (4) to withstand deformation is 0.2% yield strength. This characteristic is particularly required of a thin-walled heat dissipating plate (4) and it can be prevented from deforming if it has a 0.2% yield strength of at least 300 N/mm$^2$. Below 300 N/mm$^2$, an IC package will deform during assembly and use and its operational reliability will drop. Preferably, a 0.2% yield strength of at least 350 N/mm$^2$ is desired.

For processing the heat dissipating plate (4), etching may be performed to shape it if it is a heat spreader; however, pressing is more advantageous in terms of cost. If pressing is to be performed, it is difficult to feed the material (9) into a mold unless it does not have sufficient strength to keep it flat. If the 0.2% yield strength is at least 300 N/mm$^2$, pressing can be performed smoothly; below 300 N/mm$^2$, it becomes difficult to feed the material (9) into the mold and punch it out with high precision.

The major role of the heat dissipating plate (4) is to absorb the heat generated from the semiconductor device (1) and transfer and release it to the outside. Power semiconductor modules are experiencing greater sophistication in their functions whereas the CPU of PCs is experiencing not only this but also effort toward higher density; in either case, more heat is generated and the heat dissipating plate (4) having high heat conductivity is required. It is therefore necessary that the material (9) to be used in the heat dissipating plate (4) have heat conductivity of at least 350 W/m·K. Below 350 W/m·K, the heat generated from the semiconductor device (1) during use cannot be adequately transferred to the heat sink and the operational reliability of power semiconductor modules and IC packages will drop.

The heat dissipating plate (4) is joined to the joined board (2) in the case of a power semiconductor module and to the semiconductor device (1) in the case of an IC package. When it is joined, the heat dissipating plate (4) is heated at 200–350° C. for several minutes. If this heating causes the material (9) to soften, the heat dissipating plate (4) of an IC package cannot work as a back plate. In the case of a power semiconductor module, the heat dissipating plate (4) cannot remain flat but warps. Even if the warped heat dissipating plate (4) is joined to a heat sink, the area of contact is so small that the heat dissipating quality of the plate will decrease. Furthermore, on account of the heat cycles during assembly and use, cracking may potentially occur in the solder (3) joint.

It is therefore necessary that the material (9) not soften upon heating at 400° C. for 10 minutes which is considered the joining condition that applies the greatest amount of heat in practice; in other words, the 0.2% yield strength of the heat dissipating plate (4) after this heating must be at least 90% of the initial 0.2% yield strength. Preferably, no drop in the 0.2% yield strength is desired.

Figure 2:
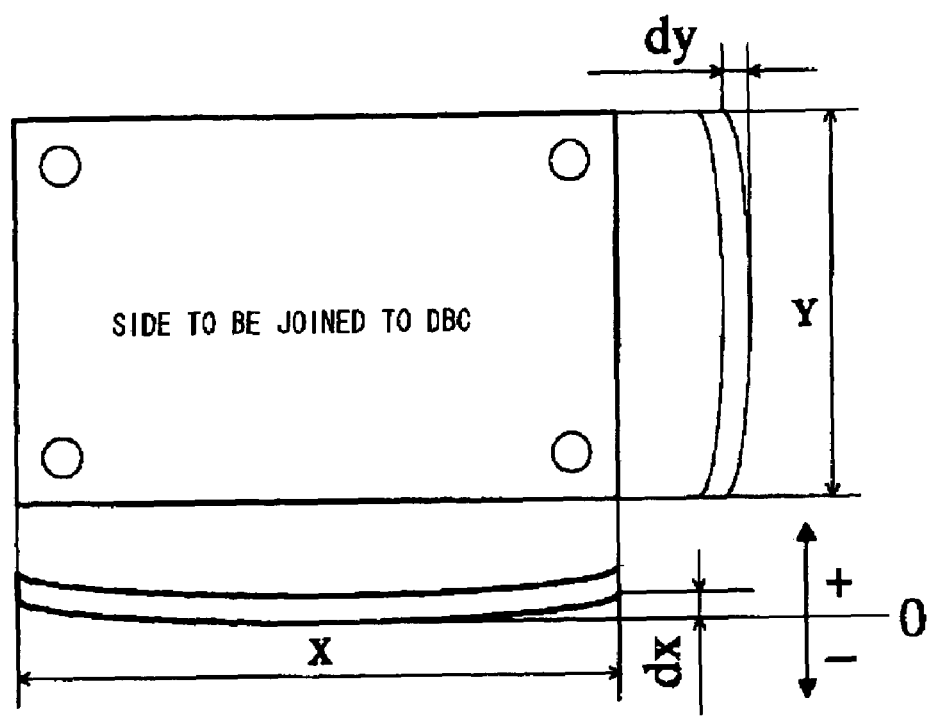
FIG. 2 shows in a plan and a side view the heat dissipating plate (4) with its length and amount of warpage indicated.

In the case of joining the heat dissipating plate (4) of a power semiconductor module to the joined board (2), if solder (3) solidifies, there occurs warpage due to the thermal expansion mismatch between the insulating substrate (15) and the heat dissipating plate (4). With a subsequent lapse of time, the solder (3) creeps, causing the heat dissipating plate (4) to deform (restore). The amount of warpage that occurs during solidification of the solder (3) is attributable to the 0.2% yield strength and heat resistance of the material (9) used in the heat dissipating plate (4), as well as to the size of the joined board (2) and the heating condition. Therefore, in order to ensure flatness, the heat dissipating plate (4) must be warped as shown in FIG. 2 considering the change (restoration) that will occur over time after joining. To describe the warp of the heat dissipating plate (4), the plane that is to be joined to the joined board. (2) is considered the upper surface; then, the warp is taken positive if it is convex downward, and negative if it is convex upward. If the amount of the warp is negative, it is totally useless in restoration after joining and no flatness is obtained after joining. If the warp is greater than +200 μm, spaces or voids are likely to occur in the joint between the joined board (2) and the heat dissipating plate (4) and the integrity of the joint will deteriorate. In addition, it becomes difficult to warp the heat dissipating plate (4) and disadvantages occur in terms of productivity and cost. Hence, the amount of the warp must not exceed 200 μm. Preferably, it is not more than 100 μm.

Figure 4:
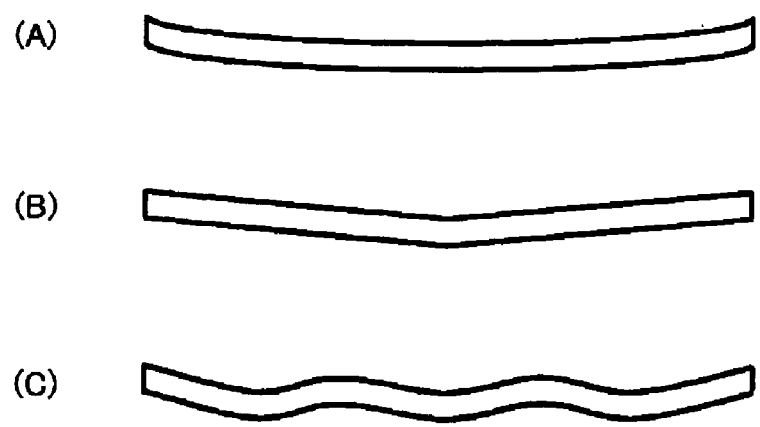
FIG. 4A is a side view showing the heat dissipating plate (4) as warped in a curved shape.
FIG. 4B is a side view showing the heat dissipating plate (4) as warped in a V shape.
FIG. 4C is a side view showing the heat dissipating plate (4) as warped in a W shape.

The shape of the warp to be created in the heat dissipating plate (4) is desirably curved as shown in FIG. 4A. Even if a V-shaped warp (see FIG. 4B) or a W-shape warp (see FIG. 4C) is created in the same amount, spaces or voids are likely to occur in the joint between the joined board (2) and the heat dissipating plate (4) and between the semiconductor device (1) and the heat dissipating plate (4), deteriorating the integrity of the joints. In addition, the insulating substrate may potentially break in the power semiconductor module. This problem might occur in the curved warp of FIG. 4A depending on its shape.

Irrespective of whether the warp is as shown in FIG. 4A or 4B or 4C, the problems described above can be solved by adjusting it to have a certain radius of curvature and upwards. If the warp's radius of curvature is at least 100 mm, the integrity of the joint will not deteriorate, nor will the insulating substrate break. If a plurality of curves are formed as shown in FIG. 4C, all of them will suffice to have a radius of curvature of at least 100 mm.

The heat dissipating plate (4) to be warped in the manner described above is also subject to size and thickness limitations. The shape of the heat dissipating plate (4) is generally a square or a rectangle. Up to 10 holes of no more than Φ 20 mm may be bored through the heat dissipating plate (4) in order to screw it down to a heat sink. Depending on the use, corners of the square or rectangle may be suitably worked. Speaking of the size and thickness of the heat dissipating plate (4), if the length of one side is less than 10 mm or greater than 200 mm and if the thickness is less than 0.1 mm or greater than 5 mm, it is difficult to warp the heat dissipating plate; in particular, if the length of one side exceeds 200 mm and the plate thickness exceeds 5 mm, a larger facility is required and a disadvantage will occur in terms of cost.

Figure 3:
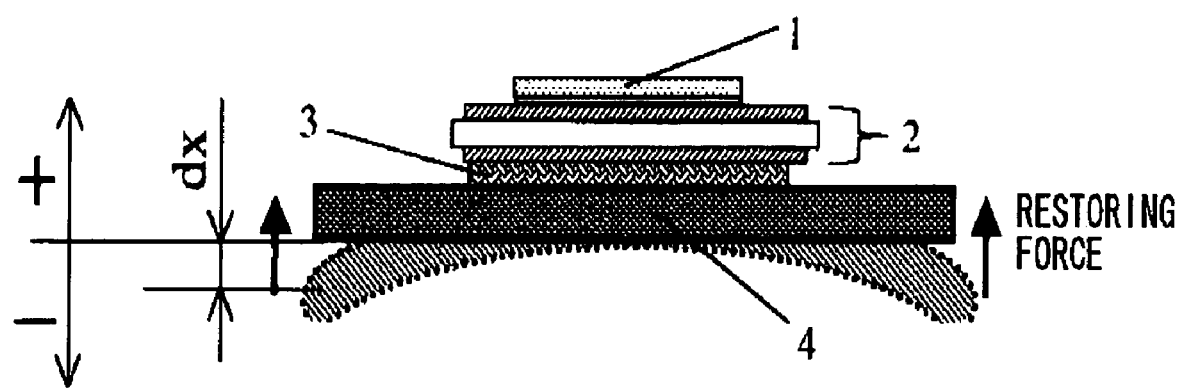
FIG. 3 is a side view illustrating the restoring force of the heat dissipating plate (4)

Speaking of the material (9) to be used in the heat dissipating plate (4), if the crystal grain size after heating in the assembling step is greater than 25 μm, it is likely to experience increased variations and the mechanical characteristic values of the plate will differ from one area to another; as a result, there will be no restoring force of the type shown in FIG. 3. Hence, the material (9) to be used in the heat dissipating plate (4) must have a crystal grain size not exceeding 25 μm after heating at 400° C. for 10 minutes. Preferably, a crystal grain size of no more than 20 μm is desired.

In order to meet the requirements that the heat conductivity be at least 350 W/m·K, the 0.2% yield strength be at least 300 N/mm$^2$, no softening occur upon heating at 400° C. for 10 minutes and that the production cost be low, copper-base alloys that utilize (Fe,Co,Ni)—P precipitates are suitable. Two common means for improving the 0.2% yield strength and heat resistance of copper-base alloys are precipitation strengthening and solid-solution strengthening. Precipitation-strengthening type copper-base alloys, as compared with solid-solution strengthening type copper-base alloys, can be improved in terms of 0.2% yield strength and heat resistance without lowering heat conductivity. Among such precipitation-strengthening type copper-base alloys, those which utilize (Fe,Co,Ni)—P precipitates are particularly used since they are advantageous from the manufacturing viewpoint in terms of materials and equipment costs.

In utilizing the (Fe,Co,Ni)—P precipitates, at least one of Fe, Co and Ni plus P must be contained in a total amount of 0.01–0.3%. Below 0.0.01%, the amount of the precipitate is too small to provide adequate 0.2% yield strength and heat resistance. Beyond 0.3%, the required heat conductivity is not obtained.

The following are examples of the invention but they are by no means intended to limit the invention.

EXAMPLE 1

Copper-base alloy Nos. 1~5 for use in the heat dissipating plate (4) of the invention and comparative copper-base alloy Nos. 6~16, with their chemical ingredients (unit of measurement: %) being shown in Table 1, were melted in a rf induction melting furnace to cast ingots of 40×40×150 (mm). From those ingots, test pieces (8) of 40×40×30 (mm) were cut, homogenized at 900° C. for 60 minutes, hot rolled to 8.0 mm, water-cooled and pickled. Thereafter, cold rolling, annealing and cold rolling were repeated to prepare test pieces (8) in plate form with a thickness of 3.0 mm.

TABLE 1

|  |  | Alloy system | Fe | Co | Ni | P | Fe + Co + Ni + P | Others | Cu |
|---|---|---|---|---|---|---|---|---|---|
| Invention samples | 1 | Cu—Fe—P | 0.05 |  |  | 0.02 | 0.07 |  | bal. |
|  | 2 | Cu—Fe—P | 0.08 |  |  | 0.03 | 0.11 |  | bal. |
|  | 3 | Cu—Co—P |  | 0.11 |  | 0.035 | 0.145 |  | bal. |
|  | 4 | Cu—Fe—Co—P | 0.06 | 0.04 |  | 0.036 | 0.136 |  | bal. |
|  | 5 | Cu—Fe—Ni—P | 0.15 |  | 0.06 | 0.05 | 0.26 |  | bal. |
| Comparative samples | 6 | Cu(C1020) |  |  |  |  |  |  | >99.9 |
|  | 7 | Cu(C1020) |  |  |  |  |  |  | >99.9 |
|  | 8 | Cu—Zr |  |  |  |  |  | Zr: 0.10 | bal |
|  | 9 | Cu—Ag |  |  |  |  |  | Ag: 0.10 | bal |
|  | 10 | Cu—P |  |  |  | 0.03 | 0.03 |  | bal |
|  | 11 | Cu—Sn |  |  |  |  |  | Sn: 0.15 | Bal |
|  | 12 | Cu—Sn—P |  |  |  | 0.006 | 0.006 | Sn: 0.15 | bal |
|  | 13 | Cu—Ni—Sn—P |  |  | 0.15 | 0.05 | 0.20 | Sn: 0.07 | bal |
|  | 14 | Cu—Mg—P |  |  |  | 0.12 | 0.12 | Mg: 0.20 | bal |
|  | 15 | Cu—Fe—P | 0.006 |  |  | 0.002 | 0.008 |  | bal |
|  | 16 | Cu—Fe—Ni—P | 0.20 |  | 0.15 | 0.07 | 0.42 |  | bal |

Figure 5:
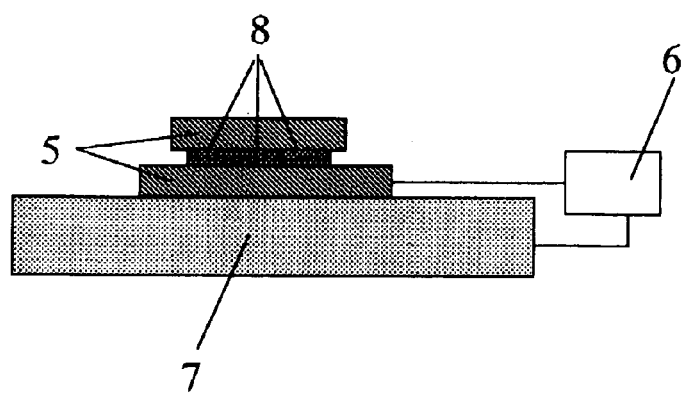
FIG. 5 is a side view of an apparatus for heating the heat dissipating plate (4)

The thus prepared copper-base alloy Nos. 1–16 were evaluated for heat conductivity, 0.2% yield strength, 0.2% yield strength and crystal grain size after heating at 400° C. for 10 minutes, and Vickers hardness (see Table 2). Heat conductivity was calculated from electrical conductivity, and electrical conductivity, 0.2% yield strength and. Vickers hardness were measured in accordance with JIS H 0505, JIS Z 2241 and JIS Z 2244, respectively. For heating at 400° C. for 10 minutes, an apparatus of the design shown in FIG. 5 was used. Crystal grain size measurement consisted of grinding the surface of the material (9) with an emery board, buffing, etching and examination under an optical microscope.

The production cost was evaluated considering the raw material cost incurred in production with the actual equipment and the rate of rejects that failed to meet the quality requirement; ○ refers to a sample of low production cost; Δ refers to a sample that had any one of three problems, high cost of additive element, low product quality and the need to perform a special treatment during production; x refers to a sample that had at least two of these problems.

Figure 6:
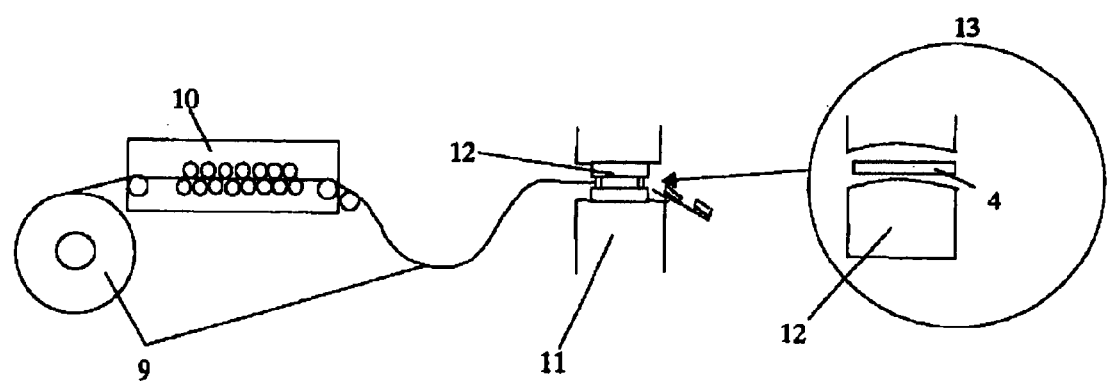
FIG. 6 is a sectional view of an apparatus for pressing a strip of copper-base alloy.
Figure 7:
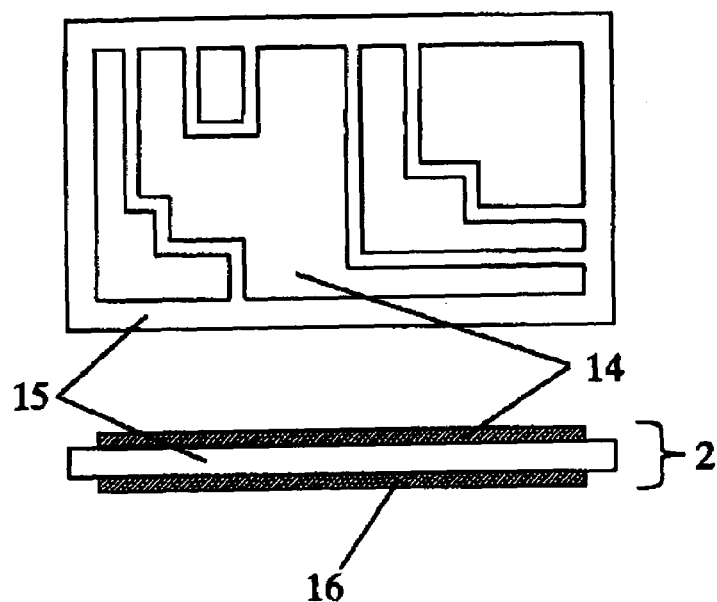
FIG. 7 shows in a plan and a side view of the joined board (2)
Figure 8:
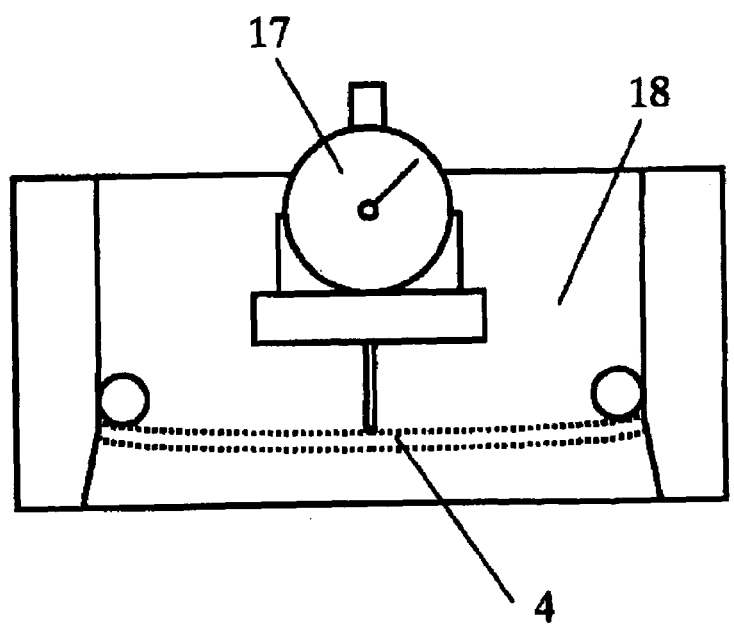
FIG. 8 is a side view of an apparatus for measuring the amount of warpage of the heat dissipating plate (4).

The copper-base alloys that had been subjected to the measurements described above were pressed with an apparatus of the design shown in FIG. 6. The pressed alloys were in plate form which was a rectangle having the longer side X (=100 mm) and the shorter side Y (=50 mm) as shown in FIG. 2, with the longer side warped in a curved shape of $d_x$=+80 μm as shown in FIG. 4A. The warp had a radius of curvature of 1200 mm. To each of the pressed plates, a joined board (2) (see FIG. 7) was joined by means of solder (3). The solder (3) was H60A of JIS Z 3282. The joining condition was 350° C. for 7 minutes. Right after the joining, the amount of warpage was measured; it was also measured when 10 hours, 50 hours and 100 hours had passed after the joining. The results are shown in Table 3. The amount of warpage was measured with an apparatus of the design shown in FIG. 8 which used a dial gage (17). The test results were evaluated in terms of the degree of flatness that remained after 100 hours. A sample was considered to have passed the test when the residual warpage was within 0±50 μm.

TABLE 2

|  | No. | Vickers hardness (HV) | Heat conductivity (W/m·K) | 0.2% yield strength (N/mm²) | | Crystal grain size (μm) after heating at 400° C. for 10 min | Production cost |
|---|---|---|---|---|---|---|---|
|  |  |  |  | before heating | after heating at 400° C. for 10 min |  |  |
| Invention samples | 1 | 109 | 364 | 313 | 309 | 20 | ○ |
|  | 2 | 114 | 358 | 350 | 345 | 17 | ○ |
|  | 3 | 115 | 360 | 381 | 377 | 18 | ○ |
|  | 4 | 130 | 358 | 400 | 385 | 11 | ○ |
|  | 5 | 121 | 353 | 389 | 372 | 14 | ○ |
| Comparative samples | 6 | 110 | 395 | 348 | 62 | 70 | ○ |
|  | 7 | 104 | 394 | 283 | 260 | 51 | ○ |
|  | 8 | 119 | 369 | 382 | 376 | 15 | X |
|  | 9 | 114 | 380 | 331 | 286 | 31 | Δ |
|  | 10 | 109 | 336 | 350 | 268 | 40 | ○ |
|  | 11 | 114 | 342 | 341 | 291 | 29 | ○ |
|  | 12 | 108 | 332 | 337 | 289 | 38 | ○ |
|  | 13 | 120 | 286 | 372 | 369 | 20 | ○ |
|  | 14 | 152 | 328 | 520 | 494 | 10 | X |
|  | 15 | 104 | 376 | 308 | 142 | 53 | ○ |
|  | 16 | 136 | 310 | 450 | 442 | 14 | ○ |

TABLE 3

| | No. | 0.2% yield strength (N/mm²) | | Amount of warpage dx (μm) | | | | | Degree of flatness |
|---|---|---|---|---|---|---|---|---|---|
| | | before heating | after heating at 400° C. for 10 min | before joining to joined board | right after joining to joined board | after 10 hr | after 50 hr | after 100 hr | |
| Invention samples | 1 | 313 | 309 | 80 | −196 | −84 | −63 | −41 | ○ |
| | 2 | 350 | 345 | 80 | −184 | −80 | −60 | −38 | ○ |
| | 3 | 381 | 377 | 80 | −173 | −61 | −39 | −21 | ○ |
| | 4 | 400 | 385 | 80 | −168 | −56 | −34 | −18 | ○ |
| | 5 | 389 | 372 | 80 | −175 | −64 | −41 | −24 | ○ |
| Comparative samples | 6 | 348 | 62 | 80 | −250 | −220 | −220 | −220 | X |
| | 7 | 283 | 260 | 80 | −240 | −150 | −145 | −140 | X |
| | 8 | 382 | 376 | 80 | −177 | −65 | −46 | −28 | ○ |
| | 9 | 331 | 286 | 80 | −228 | −110 | −94 | −82 | X |
| | 10 | 350 | 268 | 80 | −240 | −147 | −141 | −135 | X |
| | 11 | 341 | 291 | 80 | −208 | −90 | −78 | −57 | X |
| | 12 | 337 | 289 | 80 | −218 | −103 | −87 | −68 | X |
| | 13 | 372 | 369 | 80 | −180 | −73 | −53 | −31 | ○ |
| | 14 | 520 | 494 | 80 | −130 | −20 | −6 | +8 | ○ |
| | 15 | 308 | 142 | 80 | −242 | −210 | −204 | −197 | X |
| | 16 | 450 | 442 | 80 | −156 | −41 | −16 | −3 | ○ |

As can be seen from the results shown in Tables 2 and 3, invention sample Nos. 1~5 could be produced at low cost, had high heat conductivity, adequate mechanical strength and assured high degree of flatness after joining to the joined board (2). Therefore, the samples of the invention will provide a good heat dissipating plate (4) suitable for use in power semiconductor modules, IC packages etc.

On the other hand, sample No. 7 which had a 0.2% yield strength of less than 300 N/mm² and a crystal grain size in excess of 25 μm after heating at 400° C. for 10 minutes, as well as sample Nos. 6, 9~12 and 15 of which the 0.2% yield strength after heating at 400° C. for 10 minutes was less than 90% of the initial value and which had a crystal grain size in excess of 25 μm after heating at 400° C. for 10 minutes caused the material (9) to soften during joining with solder (3) and the flatness of the material (9) was not restored by the passage of time after the joining; hence, the amount of warpage that remained when 100 hours had passed after the joining to the joined board (2) was so great that the flatness of the heat dissipating plate (4) was low. Sample Nos. 13, 14 and 16, which satisfied the criterion for evaluating the amount of warpage, had heat conductivity of less than 350 W/m·K and were poor in heat dissipating performance. Sample No. 8 satisfied the criterion for evaluating the amount of warpage and exhibited efficient heat dissipation; however, since it used Zr, the raw material cost was high; in addition, the Zr—O oxides caused adverse effects on quality during hot rolling, so sample No. 8 was also unacceptable in terms of production cost.

EXAMPLE 2

Using copper-base alloy No. 1 of the invention having the composition shown in Table 1 (see Example 1) and copper-base alloy Nos. 17~22 of the same composition as No. 1, we investigated the size of warp that was created by pressing and the flatness of the pressed plate that remained after joining to the joined board (2). Copper-base alloy Nos. 1 and 17~22 were pressed with the apparatus shown in FIG. 6. The pressed alloys were in plate form which was a rectangle having the longer side X (=100 mm) and the shorter side Y (=50 mm) as shown in FIG. 2. The longer side of each sample was warped in a curved shape as shown in FIG. 4A; for the amounts of warp, see Table 4.

The thus pressed plates were joined to the joined board (2). The method of joining, the method of measuring the degree of flatness and the criteria for evaluating the amount of warp after joining to the joined board (2) were the same as in Example 1. The integrity of the joint was evaluated by checking to see if cracking occurred within 100 hours after joining to the joined board (2): x, cracked; ○, not cracked. The ease of warping was evaluated by the following criteria: x, the apparatus of FIG. 6 alone could not create warp and correction with a leveler (10) and a hammer was necessary; ○, warping was possible by the apparatus of FIG. 6.

TABLE 4

| | No. | Amount of warpage dx (μm) | | | | | Degree of flatness | Integrity of the joint | Ease of warping |
|---|---|---|---|---|---|---|---|---|---|
| | | before joining to joined board | right after joining to joined board | after 10 hr | after 50 hr | after 100 hr | | | |
| Invention samples | 1 | +80 | −196 | −84 | −63 | −41 | ○ | ○ | ○ |
| | 17 | +30 | −230 | −96 | −74 | −48 | ○ | ○ | ○ |

TABLE 4-continued

| | No. | Amount of warpage dx (μm) | | | | | Degree of flatness | Integrity of the joint | Ease of warping |
| | | before joining to joined board | right after joining to joined board | after 10 hr | after 50 hr | after 100 hr | | | |
|---|---|---|---|---|---|---|---|---|---|
| | 18 | +130 | −150 | −58 | −49 | −26 | ○ | ○ | ○ |
| | 19 | +200 | −61 | +8 | +24 | +31 | ○ | ○ | ○ |
| Comparative samples | 20 | −20 | −260 | −117 | −94 | −75 | X | ○ | ○ |
| | 21 | +250 | −17 | +31 | +42 | +48 | ○ | X | X |
| | 22 | +300 | +29 | +68 | +77 | +81 | X | X | X |

As one can see from the results shown in Table 4, invention alloy Nos. 1 and 17~19 had high degree of flatness after they were joined to the joined board (2); in addition, no defects such as cracking occurred in the solder (3) joint and the samples could be easily warped. On the other hand, sample No. 20 that was warped in an amount of less than 0 μm had low degree of flatness after it was joined to the joined board (2); sample Nos. 21 and 22 that were warped in an amount of more than 200 μm had low integrity of the solder (3) joint since cracking occurred in it; in addition, sample Nos. 21 and 22 could not be easily warped. Therefore, the samples of the invention will provide a good heat dissipating plate (4) suitable for use in power semiconductor modules.

EXAMPLE 3

Using copper-base alloy Nos. 23~32 of the same composition as copper-base alloy No. 1 of the invention having the composition shown in Table 1 (see Example 1), we investigated the shape of plates and the ease with which they could be warped. Test pieces (8) in plate form with a thickness of 8.0 mm were prepared from the copper-base alloys of the same composition as copper-base alloy No. 1 in accordance with the production method of Example 1; thereafter, cold rolling and annealing were repeated to prepare test pieces (8) in plate form having various thicknesses as shown in Table 5 for Nos. 23~32. The thus produced copper-base alloy Nos. 23~32 were pressed with the apparatus shown in FIG. 6. The pressed alloys in plate form were of the sizes shown in Table 5 and warped in the amounts also shown in Table 5; the warped plates were of a curved shape as shown in FIG. 4A. The value "0 μm" as the amount of warpage was tested in order to investigate the flatness of an as-punched plate without warping it after pressing.

Sample Nos. 23~27 shown in Table 5 had shapes in the scope of the invention whereas sample Nos. 28~32 had comparative shapes; 10 pieces of each sample were pressed. The ease of warping was evaluated by the number of plates that has to be corrected with the leveler (10) and a hammer. The amount of warpage was evaluated by checking to see if the requirement of the target value ±10 μm was met.

TABLE 5

| | No. | Plate thickness (mm) | Length (mm) | | Amount of warpage in the longer side (μm) | Ease of warping |
| | | | longer side | shorter side | | |
|---|---|---|---|---|---|---|
| Invention samples | 23 | 0.30 | 100 | 50 | 0 ± 10 | 0/10 |
| | 24 | 0.30 | 100 | 50 | 100 ± 10 | 0/10 |
| | 25 | 0.30 | 150 | 100 | 0 ± 10 | 0/10 |
| | 26 | 1.00 | 100 | 50 | 0 ± 10 | 0/10 |
| | 27 | 3.00 | 100 | 50 | 0 ± 10 | 0/10 |
| Comparative samples | 28 | 0.08 | 100 | 50 | 0 ± 10 | 2/10 |
| | 29 | 0.30 | 250 | 180 | 100 ± 10 | 1/10 |
| | 30 | 1.00 | 250 | 180 | 100 ± 10 | 3/10 |
| | 31 | 3.00 | 250 | 180 | 100 ± 10 | 5/10 |
| | 32 | 6.00 | 100 | 50 | 0 ± 10 | 3/10 |

As one can see from the results shown in Table 5, none of sample Nos. 23~27 having shapes in the scope of the invention required plate correction after pressing and they all had good press formability. Thus, the samples of the invention, which could be produced efficiently on press while exhibiting high degree of flatness after being punched on press, will provide a good heat dissipating plate (4) suitable for use in power semiconductor modules and IC packages. On the other hand, sample No. 28 with a plate thickness of less than 0.1 mm, sample No. 32 with a plate thickness in excess of 5 mm and sample. Nos. 29~31 the longer sides of which were longer than 200 mm had a common problem of variations in the amount of warpage and, hence, they could not be warped satisfactorily.

EXAMPLE 4

Using copper base alloy Nos. 33~39 of the same composition as copper-base alloy No. 1 of the invention having the composition shown in Table 1 (see Example 1), we investigated the shape of warp and the integrity of the solder (3) joint between the joined board (2) and the heat dissipating plate (4). The copper-base alloys having the same composition as the invention sample No. 1 were pressed with the apparatus shown in FIG. 6. The pressed alloys were in plate form which was a rectangle having the longer side X (=100 mm) and the shorter side Y (=50 mm) as shown in FIG. 2, with the longer side warped in an amount of $d_x=+80$ μm and curved with the radii shown in Table 6. Either one curve or three curves were provided as shown in FIG. 4A or 4C. When three curves were provided, the center one had the smallest radius of curvature. The thus pressed plates were joined to the joined board (2). The method of joining, the method of measuring the degree of flatness and the criteria for evaluating the amount of warpage were the same as in Example 1. The integrity of the joint was evaluated by checking to see if cracking occurred within 100 hours after joining to the joined board (2): x, cracked; ○, not cracked.

TABLE 6

|  | No. | No. of curves | Radius of curvature (mm) | Amount of warpage (μm) before joining to the joined board | Amount of warpage (μm) after 100 hours of joining to the joined board | Integrity of the joint |
|---|---|---|---|---|---|---|
| Invention samples | 33 | 1 | 1500 | +80 | −38 | ○ |
|  | 34 | 1 | 800 | +80 | −42 | ○ |
|  | 35 | 1 | 100 | +80 | −45 | ○ |
|  | 36 | 3 | 500 | +80 | −44 | ○ |
| Comparative samples | 37 | 1 | 50 | +80 | −63 | X |
|  | 38 | 3 | 80 | +80 | −59 | X |
|  | 39 | 3 | 30 | +80 | −72 | X |

As one can see from the results shown in Table 6, invention sample Nos. 33~36 all had high degree of flatness after joining to the joined board (2) and no cracking occurred in the solder (3) joint. On the other hand, sample Nos. 37~39 having radii of curvature less than 100 mm had low degree of flatness and cracking occurred in the solder (3) joint. Sample Nos. 38 and 39 even cracked in the insulating substrate (15). Therefore, the samples of the invention will provide a good heat dissipating plate (4) suitable for use in power semiconductor modules.

INDUSTRIAL APPLICABILITY

As will be clear from the foregoing examples, the heat dissipating plate (4) using the copper-base alloys of the invention is satisfactory in strength, heat-conductivity, heat resistance and press formability, assures a highly reliable joint during assembly and use and can be produced at low cost. Therefore, using this heat dissipating plate (4), one can provide power semiconductor modules, IC packages and other semiconductor apparatuses having good characteristics.

The invention claimed is:

1. A heat dissipating plate which comprises a copper-base alloy having a 0.2% yield strength of at least 300 N/mm² and a heat conductivity of at least 350 W/m·K, said alloy containing P and at least one element selected from the group consisting of Fe, Co and Ni, said P and said at least one element being in a total amount of 0.01 to 0.3 wt %, said heat dissipating plate being a square or rectangle, each side of which is 10 to 200 mm long and warped by 200 μm or less, and said heat dissipating plate being 0.1 to 5 mm thick.

2. The heat dissipating plate according to claim 1, which is warped in a curved shape with a radius of curvature of at least 100 mm.

3. A power semiconductor module or an IC package which use the heat dissipating plate according to claim 2.

4. A power semiconductor module or an IC package which use the heat dissipating plate according to claim 1.

5. A heat dissipating plate which comprises a copper-base alloy having a 0.2% yield strength of at least 300 N/mm² and a heat conductivity of at least 350 W/m·K, wherein the 0.2% yield strength after heating at 400° C. for 10 minutes is at least 90% of the 0.2% yield strength before said heating, said alloy containing P and at least one element selected from the group consisting of Fe, Co and Ni, said P and said at least one element being in a total amount of 0.01 to 0.3 wt %, said heat dissipating plate being a square or rectangle, each side of which is 10 to 200 mm long and warped by 200 μm or less, and said heat dissipating plate being 0.1 to 5 mm thick.

6. The heat dissipating plate according to claim 5, which is warped in a curved shape with a radius of curvature of at least 100 mm.

7. A power semiconductor module or an IC package which use the heat dissipating plate according to claim 6.

8. A power semiconductor module or an IC package which use the heat dissipating plate according to claim 5.

9. A heat dissipating plate which comprises a copper-base alloy having a 0.2% yield strength of at least 300 N/mm², a heat conductivity of at least 350 W/m·K, and a crystal grain size after heating at 400° C. for 10 minutes being no more than 25 μm, said heat dissipating plate being a square or a rectangle, each side of which is 10 to 200 mm long, said alloy containing P and at least one element selected from the group consisting of Fe, Co and Ni, said P and said at least one element being in a total amount of 0.01 to 0.3 wt %, said heat dissipating plate being a square or a rectangle, each side of which is 10 to 200 mm long and warred by 200 μm or less, and said heat dissipating plate being 0.1 to 5 mm thick.

10. The heat dissipating plate according to claim 9, which is warped in a curved shape with a radius of curvature of at least 100 mm.

11. A power semiconductor module or an IC package which use the heat dissipating plate according to claim 10.

12. A power semiconductor module or an IC package which use the heat dissipating plate according to claim 9.

13. A heat dissipating plate which is a copper-base alloy having a 0.2% yield strength of at least 300 N/mm² and a heat conductivity of at least 350 W/m·K, wherein the 0.2% yield strength after heating at 400° C. for 10 minutes is at least 90% of the 0.2% yield strength before said heating and the crystal grain size after said heating is no more than 25 µm, said heat dissipating plate being a square or a rectangle, each side of which is 10 to 200 mm long, said alloy containing P and at least one element selected from the group consisting of Fe, Co and Ni, said P and said at least one element being in a total amount of 0.01 to 0.3 wt %, said heat dissipating plate being a square or a rectangle, each side of which is 10 to 200 mm long and warped by 200 µm or less, and said heat dissipating plate being 0.1 to 5 mm thick.

14. The heat dissipating plate according to claim 13, which is warped in a curved shape with a radius of curvature of at least 100 mm.

15. A power semiconductor module or an IC package which use the heat dissipating plate according to claim 14.

16. A power semiconductor module or an IC package which use the heat dissipating plate according to claim 13.

* * * * *